United States Patent
Zhong et al.

(10) Patent No.: US 7,286,368 B2
(45) Date of Patent: Oct. 23, 2007

(54) SYSTEM TO CONTROL EFFECTIVE SERIES RESISTANCE OF DECOUPLING CAPACITOR

(75) Inventors: Dong Zhong, San Jose, CA (US);
David G. Figueroa, Tolleson, AZ (US);
Yuan-Liang Li, Chandler, AZ (US);
Michael M. Desmith, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 293 days.

(21) Appl. No.: 10/976,716

(22) Filed: Oct. 29, 2004

(65) Prior Publication Data

US 2006/0091564 A1 May 4, 2006

(51) Int. Cl.
*H05K 7/00* (2006.01)
(52) U.S. Cl. .................. 361/782; 361/738; 361/763
(58) Field of Classification Search .. 361/306.1–306.3, 361/321.1–321.5, 311, 312, 313
See application file for complete search history.

(56) References Cited

U.S. PATENT DOCUMENTS

| | | | |
|---|---|---|---|
| 5,099,387 A * | 3/1992 | Kato et al. | 361/321.2 |
| 6,496,355 B1 * | 12/2002 | Galvagni et al. | 361/306.3 |
| 6,956,731 B2 * | 10/2005 | Yoshii et al. | 361/321.1 |
| 7,054,136 B2 * | 5/2006 | Ritter et al. | 361/309 |
| 2003/0147226 A1 * | 8/2003 | Devey | |

FOREIGN PATENT DOCUMENTS

WO        WO03/075295        *  9/2003

* cited by examiner

*Primary Examiner*—Dean A. Reichard
*Assistant Examiner*—Yuriy Semenenko
(74) *Attorney, Agent, or Firm*—Buckley, Maschoff & Talwalkar LLC

(57) ABSTRACT

According to some embodiments, a system includes an integrated circuit package to support an integrated circuit die. The integrated circuit package may include a plurality of conductive contacts and a decoupling capacitor. The decoupling capacitor may include a positive terminal contact pad coupled to a first one of the plurality of conductive contacts, the positive terminal contact pad comprising a first substantially non-conductive area, and a negative terminal contact pad coupled to a second one of the plurality of conductive contacts, the negative terminal contact pad comprising a second substantially non-conductive area.

4 Claims, 9 Drawing Sheets

SYSTEM TO CONTROL EFFECTIVE SERIES RESISTANCE OF DECOUPLING CAPACITOR

BACKGROUND

An integrated circuit package may provide physical protection to an integrated circuit die, dissipate heat generated by the integrated circuit die, and electrically connect the integrated circuit die to external circuitry. In the latter regard, a conventional integrated circuit package may provide power and ground planes for distributing and routing power signals between the integrated circuit die and a motherboard. The transmission of these signals often results in unwanted resonance between the motherboard and the integrated circuit package, which may negatively affect the performance of the integrated circuit die.

DETAILED DESCRIPTION

Figure 1:
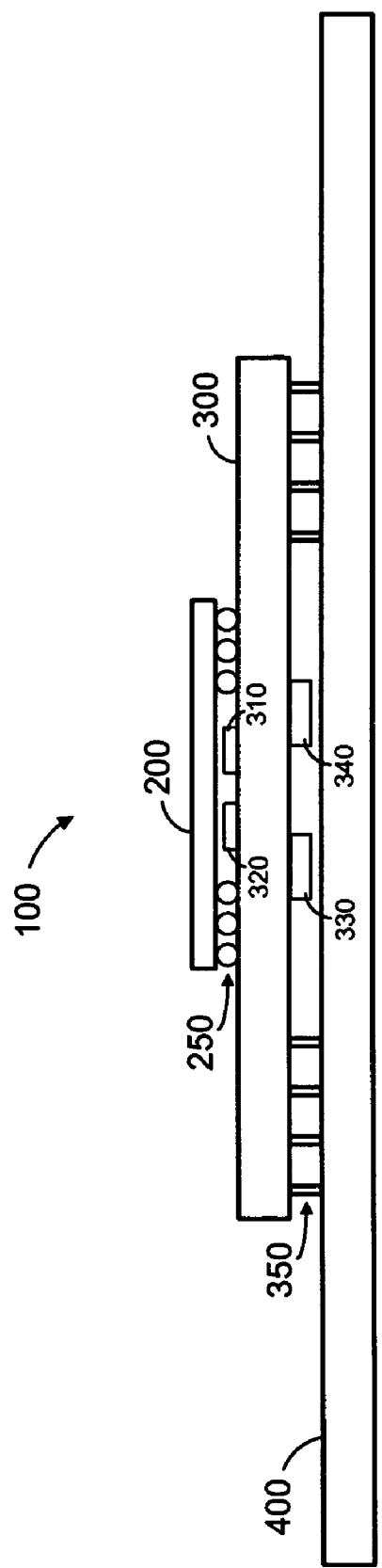
FIG. 1 is a cutaway side elevation of a system according to some embodiments.

FIG. 1 is a side elevation of system 100 according to some embodiments. System 100 includes integrated circuit die 200, integrated circuit package 300, and motherboard 400. Integrated circuit die 200 may be fabricated using any suitable substrate material and fabrication technique and may provide any functions to system 100. In some embodiments, integrated circuit die 200 is a microprocessor die having a silicon substrate.

Integrated circuit package 300 may comprise any ceramic, organic, and/or other suitable material. Package 300 is electrically coupled to circuit elements of die 200 by Controlled Collapse Chip Connect (C4) solder bumps 250. In some embodiments, integrated circuit package 300 is electrically coupled to circuit 200 via wirebonds.

Decoupling capacitors 310 through 340 are coupled to integrated circuit package 300. As will be described in detail below, each of capacitors 310 through 340 may include a positive terminal contact pad and a negative terminal contact pad for coupling to respective conductive contacts of integrated circuit package 300. Each positive terminal contact pad may include a first substantially non-conductive area, and each negative terminal contact pad may include a second substantially non-conductive area. Such an arrangement may provide control over the equivalent series resistance of each of capacitors 310 through 340. Some embodiments of the foregoing may reduce resonance between package 300 and motherboard 400 more effectively and/or more efficiently than conventional systems.

Pins 350 couple package 300 to motherboard 400. Pins 350 may carry power and other electrical signals between motherboard 400 and die 200. In some embodiments, pins 350 interface with a socket (not shown) of motherboard 400. According to some embodiments, integrated circuit package 300 is a surface-mountable substrate such as an Organic Land Grid Array substrate that may be mounted directly on motherboard 400 or mounted on a pinned interposer which mates with a socket of motherboard 400. Packaging systems other than those mentioned above may be used in conjunction with some embodiments.

Figure 2:
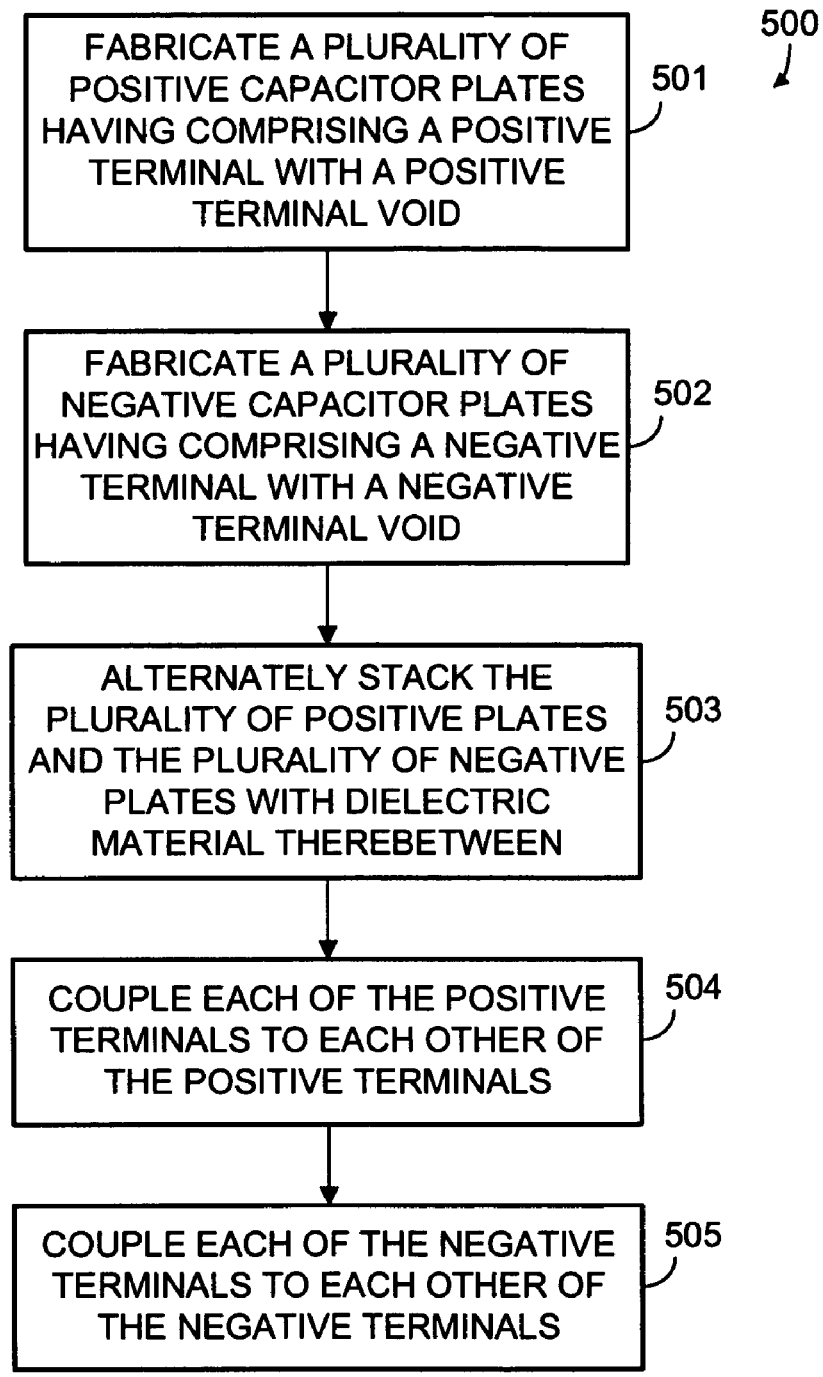
FIG. 2 is a flow diagram of a method according to some embodiments.

FIG. 2 is a flow diagram of a method according to some embodiments. Method 500 may be executed by any combination of hardware, software and/or firmware, and some or all of method 500 may be performed manually. Portions of method 500 may be performed by different entities. For example, method 500 may be performed by any combination of an integrated circuit manufacturer, a capacitor manufacturer, and a system integrator.

Initially, at 501, a plurality of positive capacitor plates are fabricated. Each of the positive capacitor plates includes a positive terminal with a positive terminal void. FIG. 3A is a top view of a positive capacitor plate fabricated at 501 according to some embodiments. Positive capacitor plate 600 includes positive plate region 601 and positive terminal 602. Positive terminal 602 comprises voids 603 through 606. Voids 603 through 606 are substantially non-conductive at the voltages and currents to be used in conjunction with positive capacitor plate 600.

Positive capacitor plate 600 may be fabricated at 501 according to any suitable method that is or becomes known. According to some embodiments, plate 600 is fabricated without voids 603 through 606 using conventional fabrication techniques. Next, voids 603 through 606 are formed by stamping a metal die onto positive terminal 602. Capacitor plate 600 may comprise any suitable currently- or hereafter-known material or materials, including but not limited to copper. Region 601 and terminal 602 may comprise different, similar, or identical materials.

Next, a plurality of negative capacitor plates are fabricated at 502. Each of the negative capacitor plates includes a negative terminal with a negative terminal void. A top view of a negative capacitor plate fabricated according to some embodiments is shown in FIG. 3B. Negative capacitor plate 610 includes negative plate region 611 and positive terminal 612. Negative terminal 612 comprises voids 613 through 616, which are also substantially non-conductive at the operational voltages and currents of negative capacitor plate 610. Negative capacitor plate 610 may be fabricated according to any suitable method and composed of any suitable materials as described above with respect to positive capacitor plate 600.

The number and dimensions of each of voids 603 through 606 and 613 through 616 may be specified to provide a particular equivalent series resistance to a capacitor composed of plates 600 and 610. Generally, the total equivalent series resistance of such a capacitor increases as the total area of the voids increases. According to some embodiments, the equivalent series resistance may be designed to more effectively and/or more efficiently reduce resonance of a power delivery system to which the capacitor is coupled.

Returning to method 500, the plurality of positive plates are alternately stacked with the plurality of negative plates. Dielectric material is disposed between each plate of the stack. FIG. 3C is a cutaway side view of capacitor 800 comprising such a stack. As shown, negative capacitor plate 610 is stacked on positive capacitor plate 600 with dielectric material 700 disposed therebetween. Dielectric material 700 may comprise any currently—or hereafter—known suitable dielectric material, and may vary in composition among the illustrated layers.

FIG. 3C also shows positive capacitor plates 620 and 640 and negative capacitor plates 630 and 650. Positive capacitor plates 620 and 640 were fabricated at 501 and share the illustrated construction of plate 600. Similarly, negative capacitor plates 630 and 650 were fabricated at 502 and share the illustrated construction of plate 610. In some embodiments, one or more of positive capacitor plates 600, 620 and 640 may be different from the others, and one or more of negative capacitor plates 610, 630 and 650 may be different from the others. For example, a number, height and width of voids in each one of capacitor plates 600 through 650 may differ from that of another one of capacitor plates 600 through 650. The number and dimensions of the respective voids may be specified such that capacitor 800 exhibits a particular equivalent series resistance.

Each positive terminal is electrically coupled to each other positive terminal at 504, and each negative terminal is electrically coupled to each other negative terminal at 505. These couplings are illustrated as vertical lines in FIG. 3C. Accordingly, the lowermost portions of the vertical lines represent the external positive (right vertical line) and negative (left vertical line) terminals of capacitor 800.

Figure 3D:
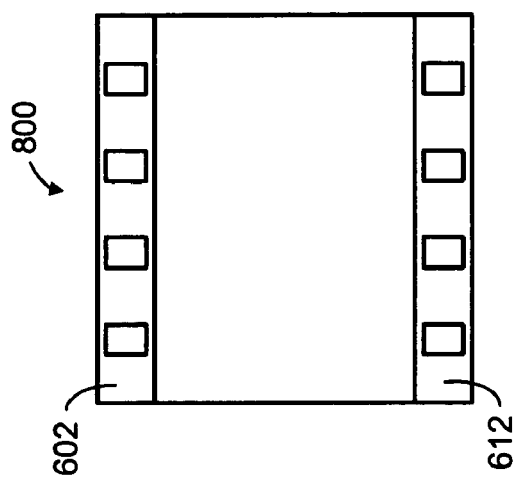
FIG. 3D is a top view of the FIG. 3C capacitor.
Figure 3C:
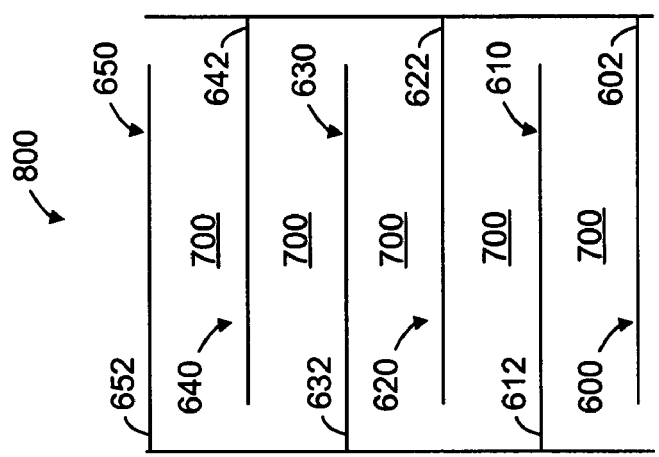
FIG. 3C is an illustrative cutaway side view of a capacitor comprising the capacitor plates of FIGS. 3A and 3B.
Figure 3A:
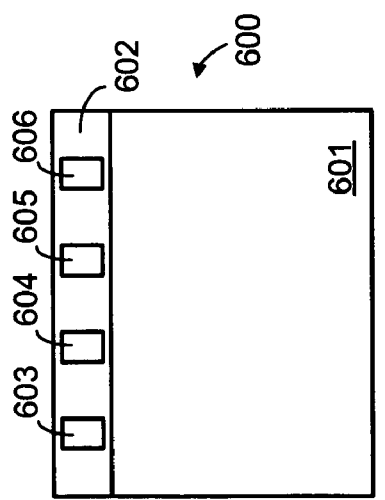
FIGS. 3A and 3B are top views of respective positive and negative capacitor plates according to some embodiments.
Figure 3B:
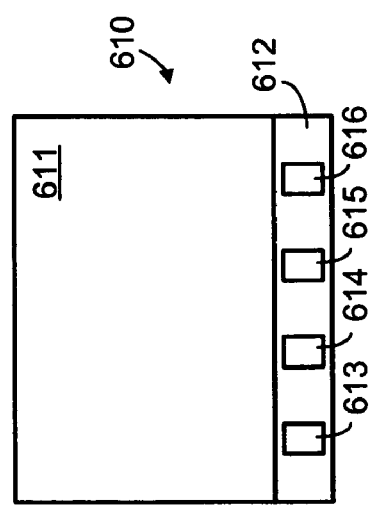

FIG. 3D is a top perspective view of capacitor 800 showing positive terminal 602 and negative terminal 612. Positive terminal 602 and negative terminal 612 may be used to electrically couple capacitor 800 to a circuit. Capacitor 800 may comprise a surface-mount capacitor for mounting to circuit boards and/or integrated circuit packages. For example, one or more of capacitors 310 through 340 may be implemented by capacitor 800.

Figure 4:
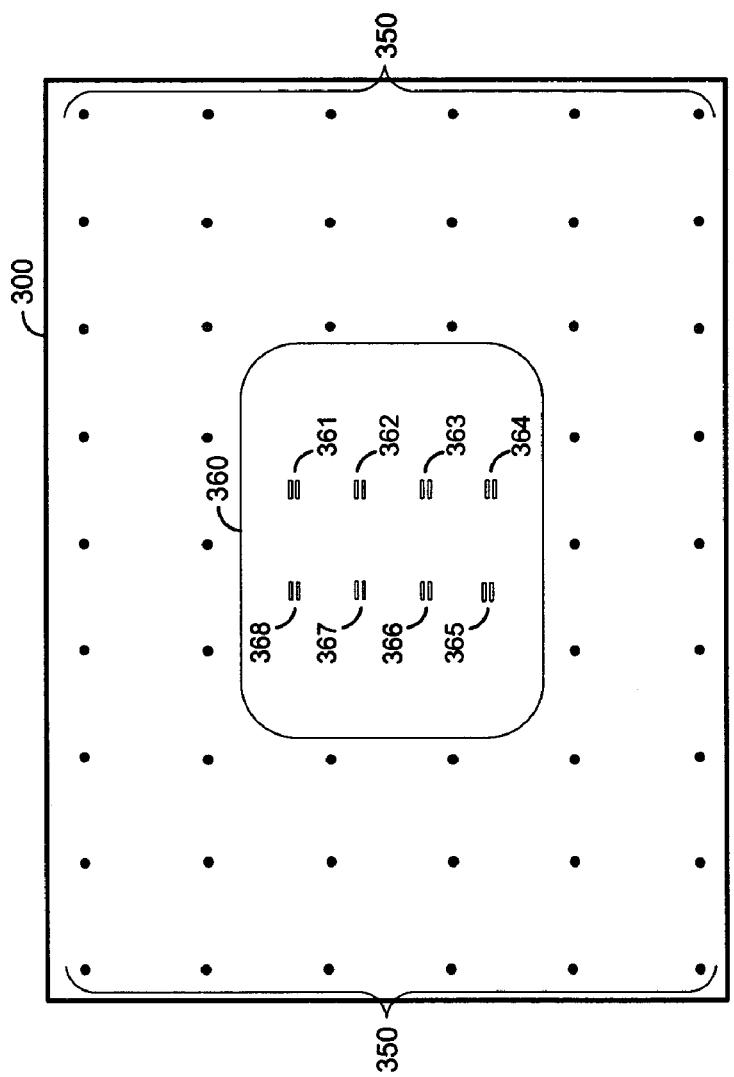
FIG. 4 is a bottom view of an integrated circuit package.

FIG. 4 is a bottom view of integrated circuit package 300 according to some embodiments. Capacitors such as capacitor 800 may be mounted to conductive contacts of package 300. Pins 350 of package 300 are disposed around recess 360, although any configuration of pins 350 may be used in conjunction with some embodiments.

Conductive contact sets 361 through 368 are also disposed within recess 360. Each of conductive contact sets 361 through 368 comprises two conductive contacts to receive a decoupling capacitor. The conductive contacts of contact sets 361 through 368 may comprise any currently- or hereafter-known conductive contacts, including but not limited to gold and/or nickel-plated copper contacts fabricated upon integrated circuit package 300. Contact sets 361 through 368 may be recessed under, flush with, or extending above the illustrated surface of package 300. According to some embodiments, the conductive contacts are coupled to a power delivery circuit of package 300. Decoupling capacitors may be mounted in recess 360 to reduce resonance between integrated circuit package 300 and a board such as motherboard 400 on which integrated circuit package 300 is to be mounted.

Figure 5:
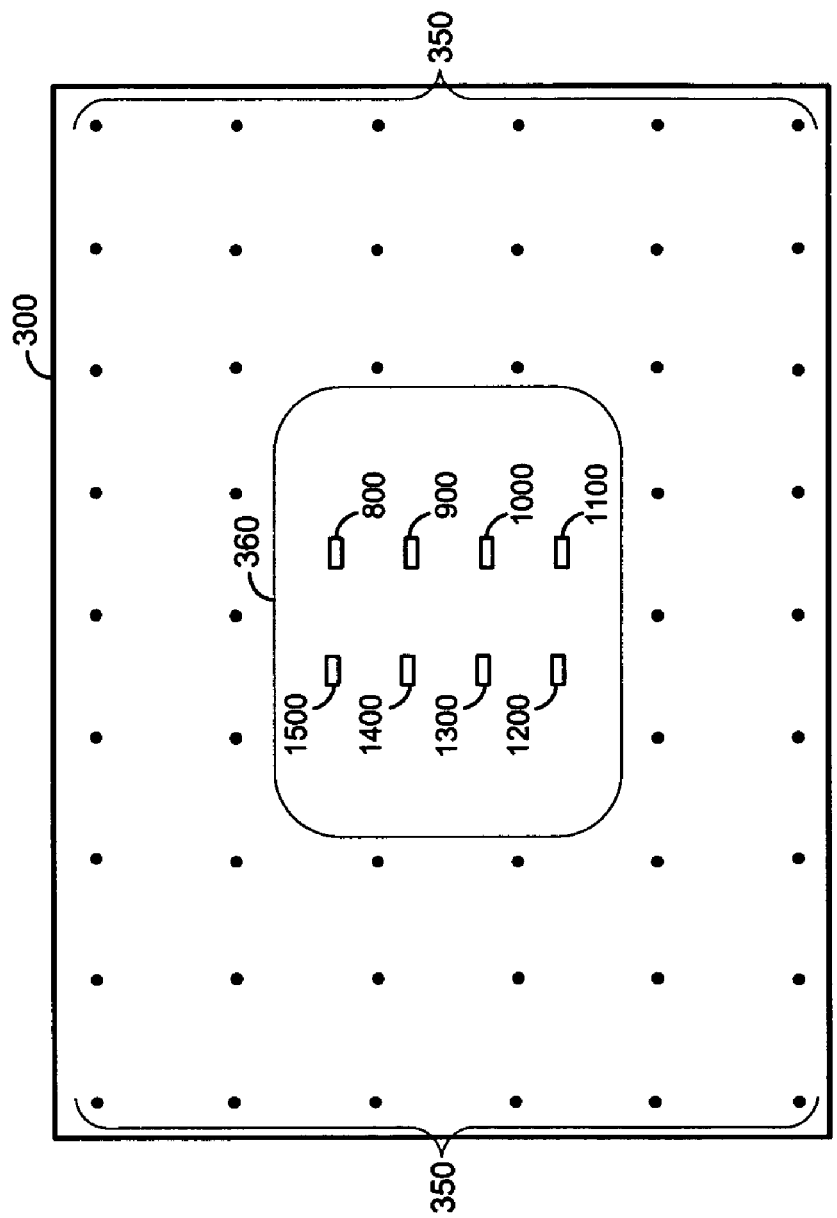
FIG. 5 is a bottom view of an integrated circuit package.

According to some embodiments, positive terminal contact pad 602 of capacitor 800 is coupled to one conductive contact of a set of conductive contacts, and negative terminal contact pad 612 is coupled to the other one of the set of conductive contacts. The coupling may be accomplished using any suitable surface-mounting technology or other system. In some embodiments, one or more conductive contacts is coated with a conductive material such as solder paste and/or conductive epoxy prior to receiving a respective one of contact pads 602 and 612. FIG. 5 is a bottom view of integrated circuit package 300 after capacitors 800 through 1500 are mounted onto respective ones of conductive contact sets 361 through 368. Capacitors 900 through 1500 also include a positive terminal contact pad comprising a first void, and a negative terminal contact pad comprising a second void.

Figure 6:
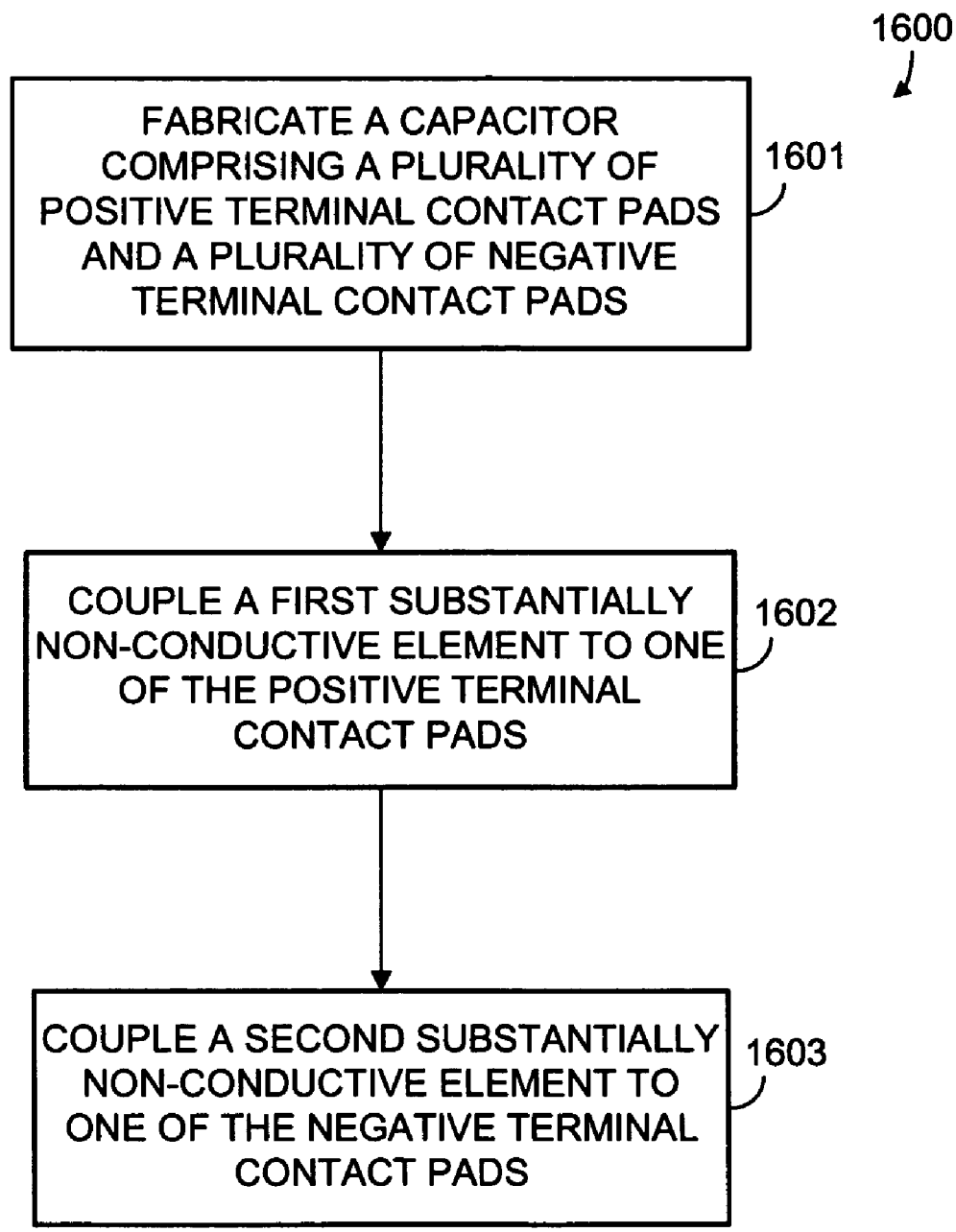
FIG. 6 is a flow diagram of a method according to some embodiments.

FIG. 6 is a flow diagram of a method according to some embodiments. Method 1600 may be executed by any combination of hardware, software and/or firmware, and some or all of method 1600 may be performed manually. As described with respect to method 500, portions of method 1600 may be performed by different entities. For example, method 1600 may be performed by any combination of an integrated circuit manufacturer, a capacitor manufacturer, and a system integrator.

Figure 7B:
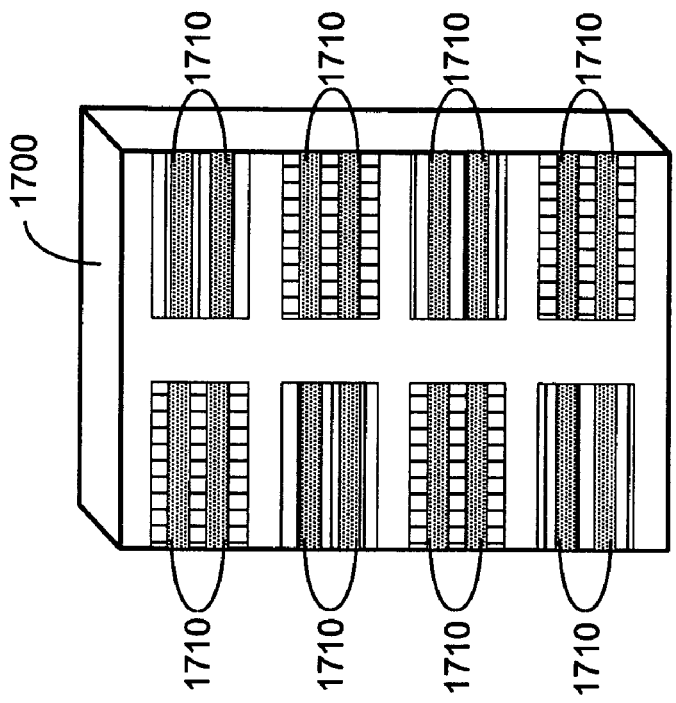
FIG. 7B is a view of an interdigitated capacitor according to some embodiments.
Figure 7A:
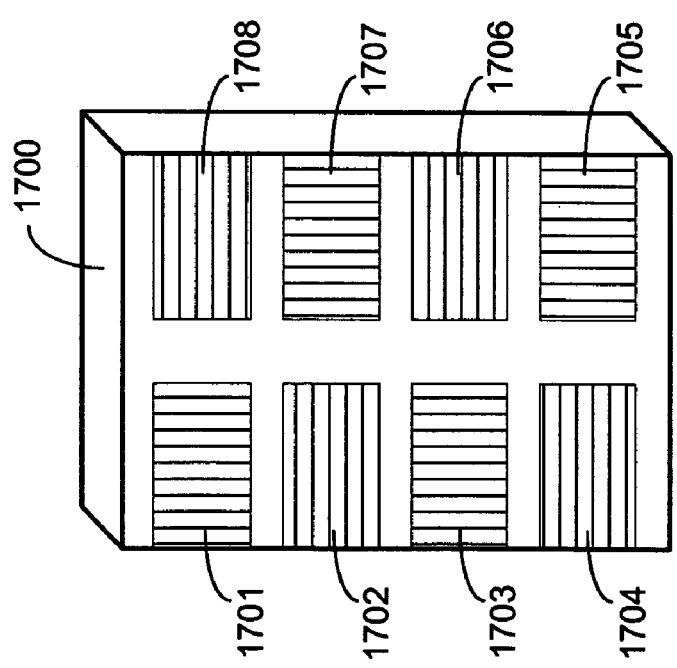
FIG. 7A is a view of an interdigitated capacitor.

Method 1600 begins at 1601, in which a capacitor is fabricated. The capacitor includes a plurality of positive terminal contact pads and a plurality of negative terminal contact pads. FIG. 7A is a perspective view of interdigitated capacitor 1700 that is fabricated according to some embodiments of 1601. Capacitor 1700 includes four positive terminal contact pads 1701, 1703, 1705 and 1707, and four negative terminal contact pads 1702, 1704, 1706 and 1708. Capacitor 1700 may be fabricated according to any system for fabricating an interdigitated capacitor that is or becomes known.

A capacitor fabricated at 1601 may comprise any type of capacitor. For example, a two-terminal capacitor such as capacitor 800 may be fabricated at 1601. Such a two-terminal capacitor may or may not include terminal voids according to some embodiments.

A first substantially non-conductive element is coupled to one of the positive terminal contact pads at 1602, and a second substantially non-conductive element is coupled to one of the negative terminal contact pads at 1603. FIG. 7B is a perspective view of capacitor 1700 after 1603 according to some embodiments. Two substantially non-conductive elements 1710 are coupled to each of positive terminal contact pads 1701, 1703, 1705 and 1707 and to each of negative terminal contact pads 1702, 1704, 1706 and 1708.

The first and second elements may be bonded to the terminal contact pads using any suitable system that is or becomes known. The first non-conductive element and the second non-conductive element may be identical or may differ in composition and/or dimension. The number, dimension and location of the elements may differ depending on the contact pads to which they are coupled. Moreover, the composition and dimensions of each element may be controlled such that capacitor 1700 provides a desired equivalent series resistance to a circuit to which capacitor 1700 is to be coupled.

According to some embodiments, the first and second elements are substantially non-conductive at the voltage and current levels to which capacitor 1700 will be subjected. The first and second elements may comprise a polymer that is fabricated as a sheet and then divided to form a plurality of non-conductive elements.

Figure 8:
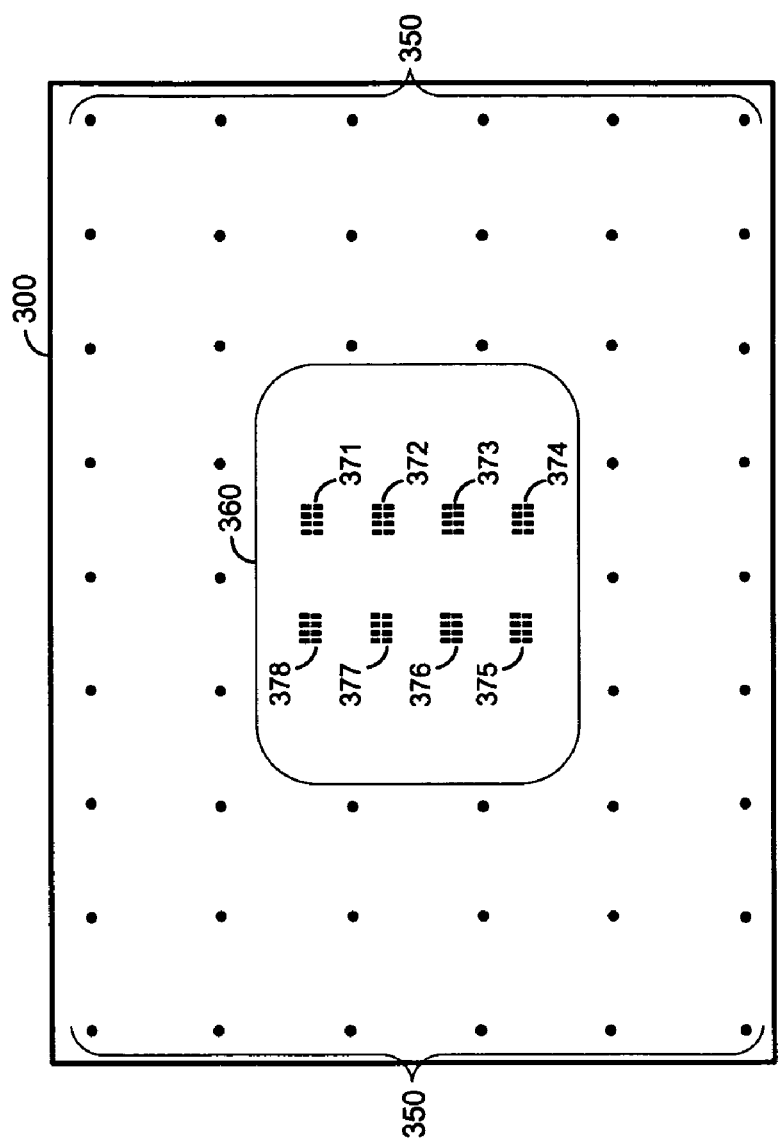
FIG. 8 is a bottom view of an integrated circuit package.

Capacitor 1700 may comprise a surface-mount capacitor for mounting to a circuit board and/or an integrated circuit package. Capacitor 1700 may implement one or more of capacitors 310 through 340 of system 100. FIG. 8 is a bottom view of integrated circuit package 300 according to some embodiments for use in conjunction with capacitor 1700. Pins 350 of package 300 are disposed around recess 360, although any configuration of pins 350 may be used in conjunction with some embodiments.

Each of conductive contact sets 371 through 378 comprises eight conductive contacts to receive a decoupling capacitor. The conductive contacts of contact sets 371 through 378 may comprise any currently- or hereafter-known conductive contacts, and may be recessed under, flush with, or extending above the illustrated surface of package 300. According to some embodiments, the conductive contacts are coupled to a power delivery circuit of package 300. Decoupling capacitors such as capacitor 1700 may be mounted in recess 360 to reduce resonance between integrated circuit package 300 and a board such as motherboard 400 on which integrated circuit package 300 is to be mounted.

According to some embodiments, a positive terminal contact pad of capacitor 1700 is coupled to one conductive contact of a set of conductive contacts 371 through 378, and a negative terminal contact pad is coupled to the other one of the set of conductive contacts 371 through 378. The coupling may be accomplished using any suitable surface-mounting technology or other system. In some embodiments, one or more conductive contacts are coated with a conductive material such as solder paste and/or conductive epoxy prior to receiving a respective contact pad of capacitor 1700.

Figure 9:
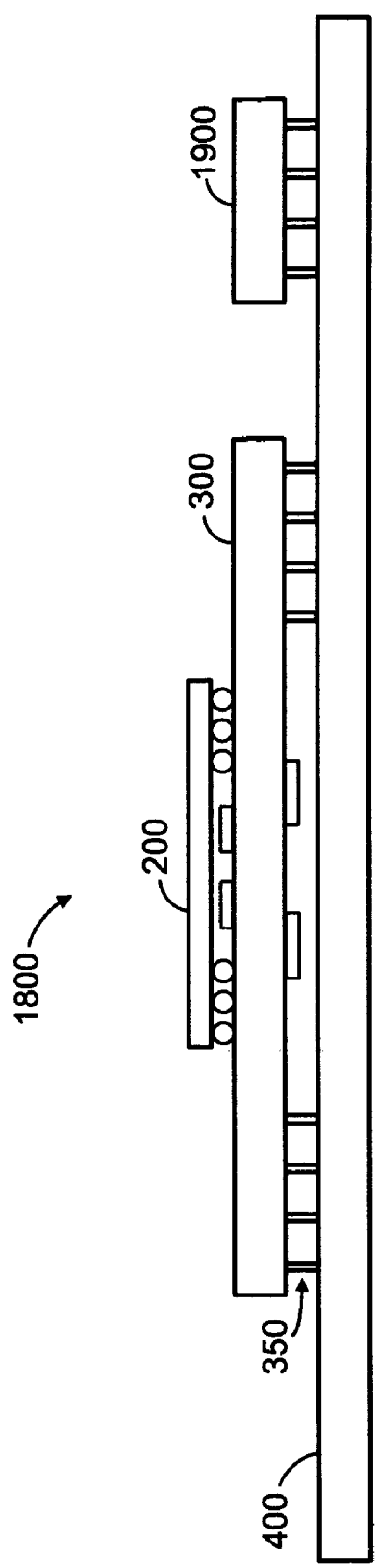
FIG. 9 is a cutaway side elevation of a system according to some embodiments.

FIG. 9 illustrates a system according to some embodiments. System 1800 includes system 100 of FIG. 1 and memory 1900. System 1800 may comprise components of a desktop computing platform. Memory 1900 and motherboard 400 may be electrically coupled to integrated circuit package 300 and integrated circuit die 200. More particularly, motherboard 400 may comprise a memory bus (not shown) coupled to pins 350 and to memory 1900. In operation, motherboard 400 may route input/output and power signals to pins 350 for transmission to integrated circuit die 200 through integrated circuit package 300. Memory 1900 may comprise any type of memory for storing data, such as a Single Data Rate Random Access Memory, a Double Data Rate Random Access Memory, or a Programmable Read Only Memory.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. An apparatus comprising:
a capacitor comprising:
a positive capacitor plate that includes a positive terminal contact pad to receive a first conductive contact, the positive terminal contact pad comprising a first substantially non-conductive area; and
a negative terminal contact pad to receive a second conductive contact, the negative terminal contact pad comprising a second substantially non-conductive area;
wherein the first substantially non-conductive area comprises a first void, and
wherein the second substantially non-conductive area comprises a second void.

2. The apparatus according to claim 1, the capacitor further comprising:
a second positive terminal contact pad to receive a third conductive contact, the second positive terminal contact pad comprising a third substantially non-conductive area; and
a second negative terminal contact pad to receive a fourth conductive contact, the second negative terminal contact pad comprising a fourth substantially non-conductive area.

3. The apparatus according to claim 1, further comprising:
an integrated circuit package comprising the first conductive contact and the second conductive contact, the first conductive contact and the second conductive contact coupled to a power delivery circuit of the integrated circuit package, wherein the first conductive contact and the second conductive contact are respectively coupled to the positive terminal contact pad and the negative terminal contact pad.

4. An apparatus comprising:
a capacitor comprising:
a positive terminal contact pad to receive a first conductive contact, the positive terminal contact pad comprising a first substantially non-conductive area; and
a negative terminal contact pad to receive a second conductive contact, the negative terminal contact pad comprising a second substantially non-conductive area;
wherein the first substantially non-conductive area comprises a first void, and
wherein the second substantially non-conductive area comprises a second void.

\* \* \* \* \*